(12) United States Patent
Starman et al.

(10) Patent No.: US 11,279,613 B2
(45) Date of Patent: Mar. 22, 2022

(54) MEMS DEVICE FOR LARGE ANGLE BEAMSTEERING

(71) Applicant: Government of the United States, as represented by the Secretary of the Air Force, Wright-Patterson AFB, OH (US)

(72) Inventors: LaVern A. Starman, Dayton, OH (US); John P K Walton, Troy, OH (US); Harris J Hall, Yellow Springs, OH (US)

( * ) Notice: Subject to any disclaimer, the term of this patent is extended or adjusted under 35 U.S.C. 154(b) by 554 days.

(21) Appl. No.: 16/052,018

(22) Filed: Aug. 1, 2018

(65) Prior Publication Data

US 2019/0039881 A1 Feb. 7, 2019

Related U.S. Application Data

(60) Provisional application No. 62/702,595, filed on Jul. 24, 2018, provisional application No. 62/667,647, (Continued)

(51) Int. Cl.
*G02B 26/08* (2006.01)
*B81B 3/00* (2006.01)

(52) U.S. Cl.
CPC ........ *B81B 3/0043* (2013.01); *G02B 26/0833* (2013.01); *G02B 26/0841* (2013.01); (Continued)

(58) Field of Classification Search
CPC ............ B81B 3/0043; B81B 2203/053; B81B 2203/058; B81B 2201/032; (Continued)

(56) References Cited

U.S. PATENT DOCUMENTS

| 7,173,748 B2 | 2/2007 | Hara et al. |
| 7,225,674 B2 | 6/2007 | Clark |

(Continued)

OTHER PUBLICATIONS

Yang et al., "A Tip-Tilt-Piston Micromirror with an Elastomeric Universal Joint Fabricated via Micromasonry," Thesis, Graduate college of the University of Illinois at Urbana-Champaign, 2014.
(Continued)

*Primary Examiner* — Euncha P Cherry
(74) *Attorney, Agent, or Firm* — AFMCLO/JAZ; Charles R Figer, Jr.

(57) ABSTRACT

An actuator element of a MEMS device is provided, which is fabricated using surface micromachining on a substrate. An insulating layer having a first portion contacts the substrate while a second portion is separated from the substrate by a gap. A metallic layer contacts the insulating layer having a first portion contacting the first portion of the insulating layer and a second portion contacting the second portion of the insulating layer. The second portion of the metallic layer is prestressed. Alternately, the actuator element includes a first insulating layer separated from the substrate by a gap. A metallic layer has a first portion contacting the substrate and a second portion contacting the insulating layer. A second insulating layer contacts a portion of the second portion of the metallic layer opposite the first insulating layer, where the second insulating layer is prestressed.

20 Claims, 13 Drawing Sheets

Related U.S. Application Data filed on May 7, 2018, provisional application No. 62/589,610, filed on Nov. 22, 2017, provisional application No. 62/587,734, filed on Nov. 17, 2017, provisional application No. 62/540,177, filed on Aug. 2, 2017.

(52) U.S. Cl.
CPC .... *G02B 26/0866* (2013.01); *B81B 2201/032* (2013.01); *B81B 2201/042* (2013.01); *B81B 2203/053* (2013.01); *B81B 2203/058* (2013.01)

(58) Field of Classification Search
CPC .......... B81B 2201/042; G02B 26/0833; G02B 26/0866; G02B 26/0841
USPC ...................................................... 359/221.2
See application file for complete search history.

(56) References Cited

U.S. PATENT DOCUMENTS

| | | | |
|---|---|---|---|
| 7,294,282 B1* | 11/2007 | Helmbrecht | G02B 26/0825 216/24 |
| 7,344,262 B2 | 3/2008 | Greywall | |
| 7,482,664 B2 | 1/2009 | Sinclair | |
| 7,486,430 B2 | 2/2009 | Gan et al. | |
| 7,699,296 B1* | 4/2010 | Knollenberg | B81B 3/0037 267/160 |
| 8,148,874 B2 | 4/2012 | Xie et al. | |
| 8,743,449 B2 | 6/2014 | Xie et al. | |
| 2013/0301101 A1 | 11/2013 | Conrad et al. | |

OTHER PUBLICATIONS

Todd et al., "A multi-degree-of-freedom micromirror utilizing inverted-series-connected bimorph actuators," J. of Optics A: Pure and Applied Optics, vol. 8, pp S352-S359, 2006.

Wu et al., "A Tip-Tilt-Piston Micromirror Array for Optical Phased Array Applications," J. of Microelectromechanical Systems, vol. 19, No. 6, pp. 1450-1461, 2010.

Jia et al., "An Electrothermal Tip-Tilt-Piston Micromirror Based on Folded Dual S-Shaped Bimorphs," J. of Microelectromechanical Systems, vol. 18, No. 5, pp. 1004-1015, 2009.

Samuelson et al., "A Large Piston Displacement MEMS Mirror With Electrothermal Ladder Actuator Arrays for Ultra-Low Tilt Applications," J. of Microelectromechanical Systems, vol. 23, No. 1, pp. 39-49, 2014.

Last et al., "A Microassembled Large-Deflection Tip/Tilt Micromirror from a Single-Mask DRIE Process," Conference Proceedings in Semantic Scholar, 2006.

Sandner et al., "Out-of-plane translatory MEMS actuator with extraordinary large stroke for optical path length modulation in miniaturized FTIR spectrometers," Sensor+Test Conference 2011—IRS Proceedings, pp. 151-156, 2011.

* cited by examiner

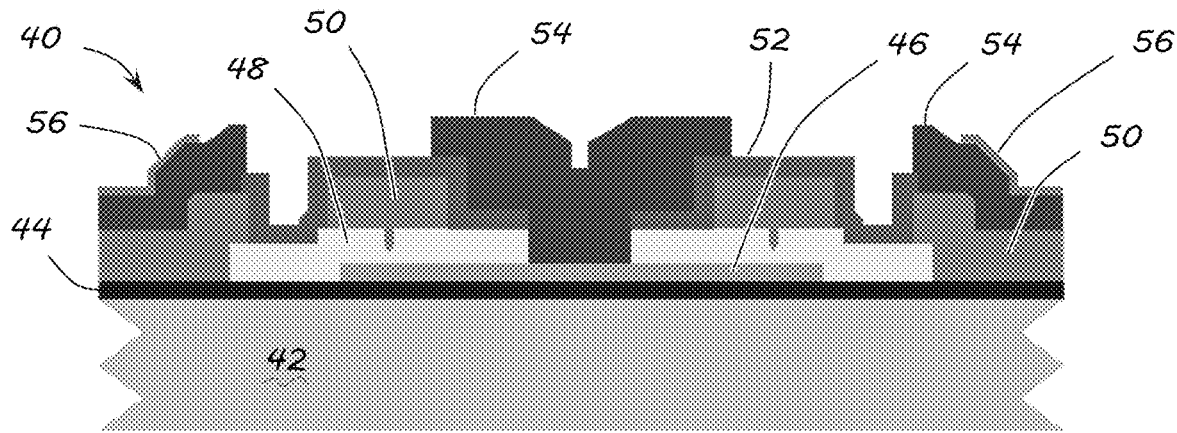

FIG. 8A

| MATERIAL LAYER | LAYER THICKNESS | LAYER DESCRIPTION |
| --- | --- | --- |
| NITRIDE (44) | 0.6 μm | PROVIDE ELECTRICAL ISOLATION FROM WAFER |
| POLY0 (46) | 0.5 μm | ELECTRICAL LAYER FOR GROUND PLANE/ELECTRODE FORMATION |
| 1ST OXIDE (48) | 2.0 μm | FIRST SACRIFICIAL LAYER PROVIDEING GAP BETWEEN POLY0 AND POLY1 LAYERS |
| POLY1 (50) | 2.0 μm | FIRST MECHANICAL LAYER |
| 2ND OXIDE (52) | 0.75 μm | SECOND SACRIFICIAL LAYER PROVIDING GAP BETWEEN POLY1 AND POLY2 |
| POLY2 (54) | 1.5 μm | SECOND MECHANICAL LAYER |
| METAL (56) | 0.5 μm | ELECTRICAL CONTACT LAYER OR OPTICALLY REFLECTIVE SURFACE |

FIG. 8B

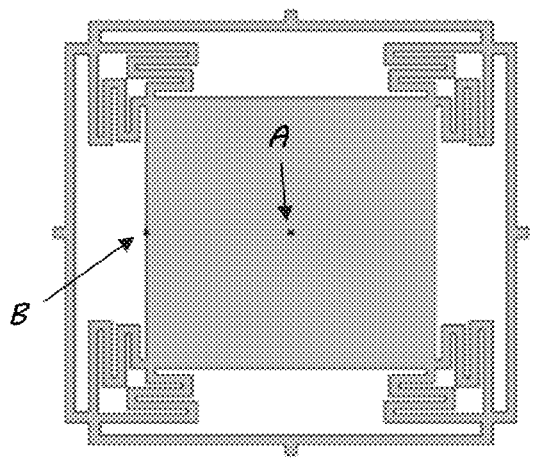
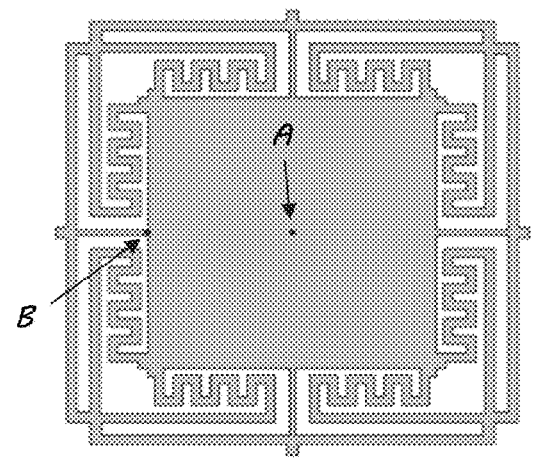
FIG. 14A  FIG. 14B
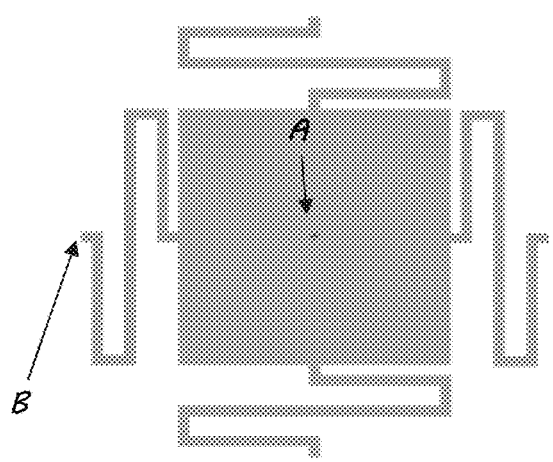
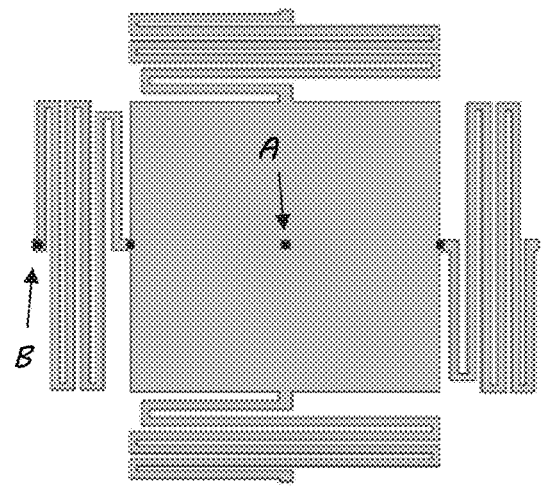
FIG. 14C  FIG. 14D

MEMS DEVICE FOR LARGE ANGLE BEAMSTEERING

CROSS-REFERENCE TO RELATED APPLICATIONS

This application claims the benefit of and priority to U.S. Provisional Application Ser. No. 62/540,177, entitled "Post-Processing Techniques on MEMS Foundry Fabricated Devices for Large Angle Beamsteering," filed on Aug. 2, 2017, and U.S. Provisional Application Ser. No. 62/587,734, entitled "Segmented Control of Electrostatically Actuated Bi-Morph Beams," filed on Nov. 17, 2017, and U.S. Provisional Application Ser. No. 62/589,610, entitled "Using Surface Micromaching to Create Large Tip, Tilt, and Piston MEMS Beamsteering Structures," filed on Nov. 22, 2017, and U.S. Provisional Application Ser. No. 62/667,647, entitled "Torsional Structures to Enable Large Angle Deflections," filed on May 7, 2018, and U.S. Provisional Application Ser. No. 62/702,595, entitled "Torsional Springs to Enable Large Angle Tip/Tilt Beamsteering using MEMS," filed on Jul. 24, 2018, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to MEMS devices and, more particularly, MEMS devices capable of large angle deflections.

Description of the Related Art

Within the past decade, numerous researches have invested time in the development of micro-electro-mechanical systems (MEMS) micromirror structures which have the ability to deflect at large angles (greater than 20 degrees). These large tip/tilt micromirrors are ideal for many applications to include microscopy, biomedical endoscopy, laser communication, wavelength selectivity, optical tuning, scene generation and various other medical instrumentations. Although many of these research efforts exhibit large tip/tilt angles, they generally do not include a piston motion for optical correction requirements or exhibit high fill-factors for large area optical scanning applications. There currently are no MEMS large angle beamsteering approaches which exhibit large tip/tilt and piston motion while exhibiting a fill-factor greater than 90%, which may be fabricated using surface micromachining. Current state of the art electrostatic designs have a maximum tip or tilt angle of ±28 degrees for a single element but generally do not possess both capabilities. Electro thermal designs have a maximum tip or tilt angle of ±40 degrees for a single element but also generally do not possess both capabilities. No approach with a tip or tilt angle of greater than 10 degrees are available which has a high fill-factor. Most if not all designs with a high fill-factor have tilt angles of less than 5 degrees.

Accordingly, there is a need in the art for MEMS micromirrors for large angle beamsteering for numerous broadband steering and imaging applications.

SUMMARY OF THE INVENTION

Micro-Electro-Mechanical Systems (MEMS) micromirrors have been employed in a wide range of optical applications for about two decades. However, scanning micromirrors are far less numerous, generally exhibit low scanning angles (less than 20°) and typically in only one direction. Embodiments of the invention provide large angle, out-of-plane bimorph MEMS micromirrors fabricated in foundry processes as well as in-house. Through modeling and simulation, several techniques are possible to meet the required large out-of-plane deflections needed for large angle beamsteering. Both a serpentine and center anchored multi-beam approach have been designed, modeled, fabricated, and tested to observe deflection and overall functionality of the structures. These structures exhibit high, out-of-plane deformations as either a MEMS electrostatic and electrothermal actuators, which can then be integrated with an SOI or some other fabricated micromirror array to enable broadband steering and imaging applications. The arrays are able to exhibit tip, tilt, and piston motion due to the individual actuation design schemes which are utilized in each micromirror structure while maintaining a high fill-factor and is scalable to large aperture and array sizes. The design methodology capitalizes on the inherent residual stresses in bimorph structures which possess different coefficients of thermal expansions (CTE). Through precise material selection, and design control (i.e. structure length, material thickness, material CTE, deposition temperature, and material layer composition), this inherent residual stress will be used to create the upward deflections required for these surface micromachined structures to enable large angle micromirror movements.

Embodiments of the invention provide a MEMS device on a substrate, which includes a platform to which a micromirror may be attached or may be used as the fabrication point for the micromirror. A least one actuator element chain composed of a plurality of actuator elements is connected to the platform. Actuation of the the plurality of the actuator elements in the actuator element chain causes motion in the platform, which can be controlled to steer the mirror. The actuator elements of the plurality of actuator elements form a chain, which may be arranged in a serpentine configuration in some embodiments or with a center contact configuration in other embodiments.

In some embodiments, the actuator elements of the MEMS device include an insulating layer having a first contacting portion and a second portion separated from an electrode by a gap. A metallic layer contacts the insulating layer and has a first portion contacting the first contacting portion of the insulating layer and a second portion contacting the second portion of the insulating layer, the second portion of the metallic layer is prestressed. In some of these embodiments the second portion of the metallic layer of the actuator element is tensilely prestressed.

In other embodiments, the actuator elements of the MEMS device include a first insulating layer positioned above the substrate and separated from the substrate by a gap. A metallic layer has a first contacting portion and a second portion contacting the insulating layer. A second insulating layer contacts a portion of the second portion of the metallic layer opposite the first insulating layer, where the second insulating layer is prestressed. In some of these embodiments, the second insulating layer of the actuator element is compressively prestressed.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 8A illustrates PolyMUMPs foundry fabrication layers for an exemplary device;

FIG. 8B contains a table with material layer descriptions and thicknesses of the exemplary device in FIG. 8A;

FIG. 14A illustrates a torsional spring attachment which exhibits a moderately high piston and tip/tilt spring constants, which will make tilt of the micromirror platform difficult;

FIG. 14B illustrates the highest spring constants which make for a very ridged and stiff structure that nearly prohibits tilting events;

FIG. 14C illustrates a lower spring constant which enables tilting but is not ridged enough such that it creates some of the negative downward motion of the opposite actuator assembly;

FIG. 14D illustrates a lower spring constant for a tip/tilt event and is rigid enough for piston actuation;

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention address the need in the art by enabling new and improved beamsteering systems with large beamsteering angles and high scanning speeds while exhibiting high fill-factor (greater than 90%) arrays, which may be scalable to large aperture sizes as well as enable a multi-beam scanning capability at a low bias voltage. Embodiments of the invention have the potential to replace conventional gimbal systems on platforms since these devices are nearly conformal, and eliminate all macro-scale moving mechanical parts of the contemporary scanning/detector systems. Embodiments of the invention would be applicable to EO/IR beamsteering systems, imaging and scene generation systems, laser communications, multi-target search and track, among others. Conventional methods use gimbal systems which are slow, single beam beamsteering with no multi-target detect/track capability. Advantages of the embodiments of the invention include elimination of most mechanical/gimbal systems on a platform, can enable multi-beam steering, low voltage, nearly conformal, adaptable and scalable to meet a wide range of applications with regards to steering angles and scanning speeds. These embodiments use MEMS to enable the large angle beamsteering, scalable with regard to array size, flexible with regards to material selection, wavelengths of interest, and deflection/steering angles while being ideal for wideband applications.

Figure 1A:
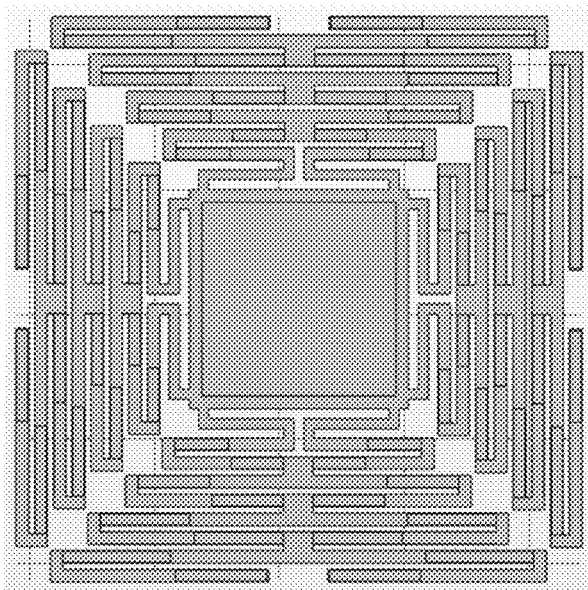
FIG. 1A is MEMS structural device used for large angle beamsteering illustrating an exemplary embodiment with a center contact design.
Figure 1B:
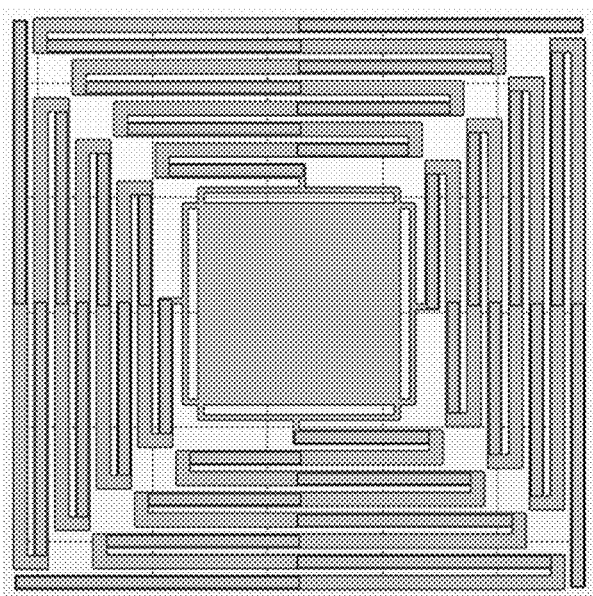
FIG. 1B is MEMS structural device used for large angle beamsteering illustrating an exemplary embodiment with a serpentine based design with the contact at the end of the first, longest cantilever beam, which is a modification of the serpentine design in FIG. 2 below.

FIGS. 1A and 1B illustrate two different structural concepts which were designed to capitalize on the inherent residual stress in materials in addition to capitalizing on the different coefficient of thermal expansion (CTE) of the bimorph material layers selected. FIG. 1A shows a basic center contact design concept with a contact pad removed for modeling purposes. This device may be biased by individually applying a voltage potential to each of the four actuators separately to create a tip & tilt scenario, or all four actuators being biased simultaneously to create a piston motion for a micromirror to enable optical phase correction. FIG. 1B illustrates a modified serpentine design concept in which the actuators can also be biased individually or all simultaneously to create the tip/tilt and piston motion as described above. These exemplary embodiments were determined for an exemplary application where a physical beam-steering actuator was limited to 1 mm² or less. This choice was made to try and maximize the initial upward deflection while also maintaining a reasonable number of control lines for individual actuation control as well as providing the necessary sensing lines to determine the precise location of the mirror with respect to elevation and angle during device operation. From either of the embodiments of FIGS. 1A and 1B, the initial upward deflection required for tip and tilt beamsteering as well as overall footprint for the design may be tailored to any desired application through a number of design and material modifications to include changing the beam lengths, changing selected materials of the bimorph beam structure, thickness of the beam material layers, the number of beams used for deflection purposes, the residual stress and CTE properties of the materials, the difference in the Young's modulus of the materials, the deposition temperatures and composition of the material layers, and the overlap of the various beams in the bimorph beams.

Some of the main differences in operational performance between the exemplary embodiments in FIGS. 1A and 1B include: 1) the center contact design exhibits a higher pull-in voltage, 2) the structural reliability of the center contact design is greater than the serpentine design, 3) the overall spring constant for the center contact design is much greater than the serpentine design, which may be advantageous in high vibration environments, and 4) the resonant frequency of the center contact is much higher than the serpentine design. Thus, there are a wide range of applications that could integrate either configuration to meet a desired application.

Figure 2:
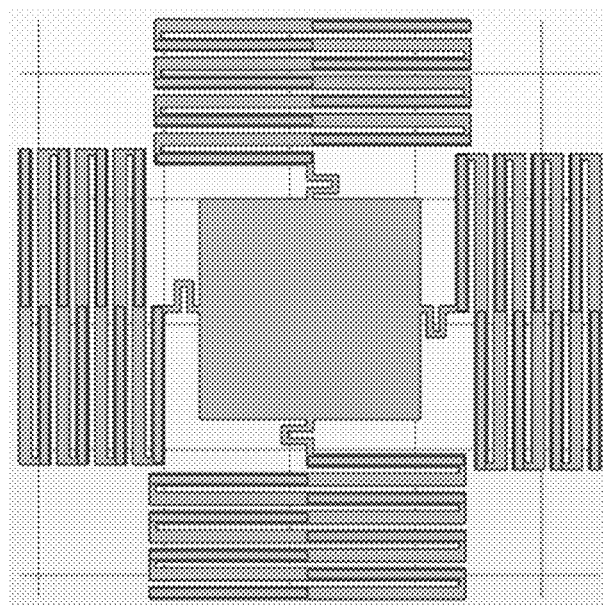
FIG. 2 illustrates and exemplary serpentine design shown.
Figure 3:
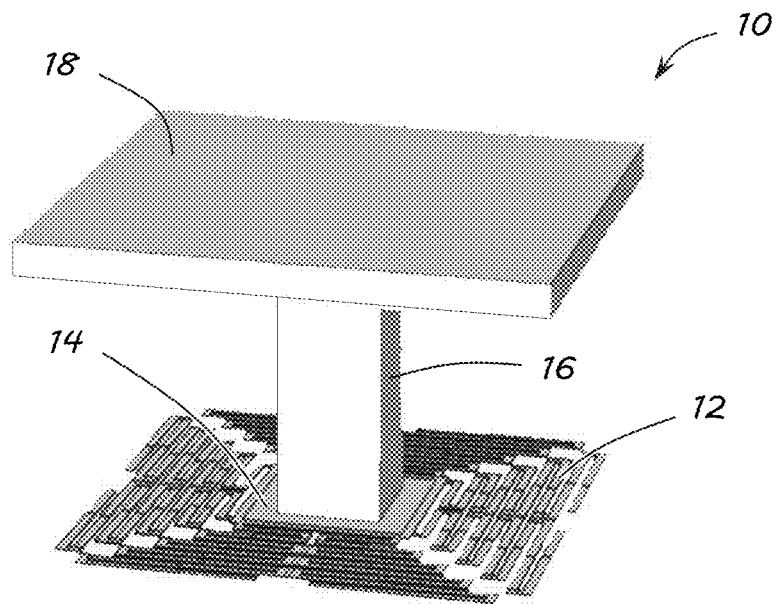
FIG. 3 illustrates an exemplary large angle beamsteering micromirror design concept using the center contact design approach.
Figure 4A:
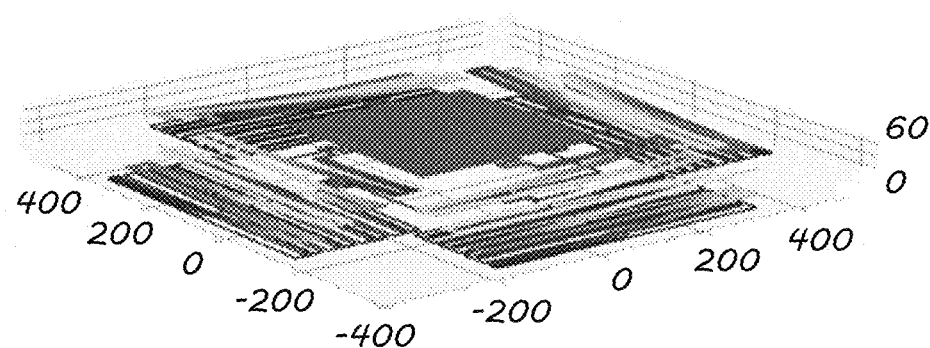
FIG. 4A illustrates the deflection of the serpentine design in FIG. 2 showing an upward deflection of about 60 μm.
Figure 4B:
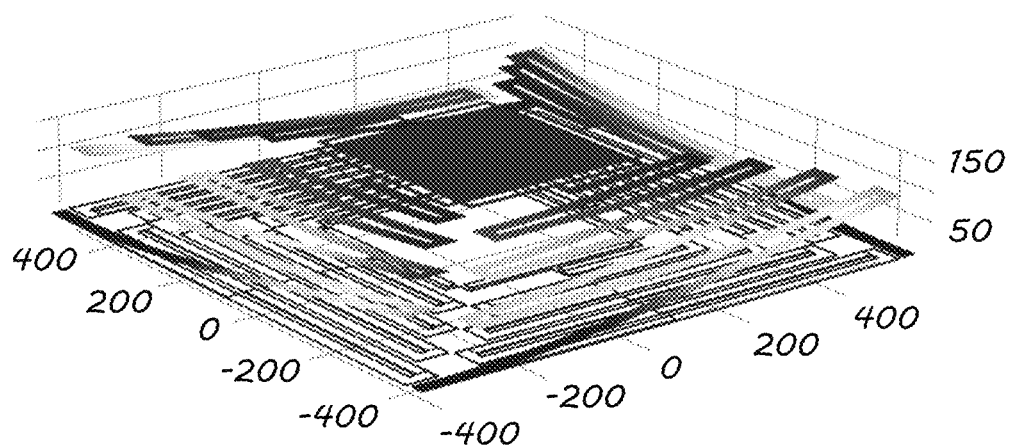
FIG. 4B illustrates the deflection of the modified serpentine design in FIG. 1B with an upward deflection of about 145 μm.

The exemplary embodiment of the serpentine design in FIG. 1B is an enhanced version of another exemplary 7-beam serpentine design as shown in FIG. 2 in which all bimorph actuator beams were set to the same length. The serpentine design in FIG. 1B utilizes available surface area of the wafer much better, which in turn aids in increasing the upward deflection. Both serpentine designs in FIGS. 1B and 2 provide low voltage pull-in for large out-of-plane deflections while maintaining a high fill-factor once coupled with the micromirror assembly as shown in FIG. 3 are not possible in most MEMS actuators. A disadvantage to the design in FIG. 2 where all beams were the same length, is that once the pull-in voltage is reached, the entire actuator structure collapses onto the electrode, mitigating any downward deflection control. The modified design in FIG. 1B improves on several concepts. First, the initial upward deflection can be increased significantly within the same footprint from the original design as the bimorph beams are optimally lengthened to enhance upward deflection as illustrated in FIGS. 4A and 4B (deflecting approximately 60 μm and 145 μm respectively). And, second, the actuators spring constant is varied with respect to the bimorph beam lengths with the lowest spring constant coming from the longest beam and steadily increases as the bimorph beams are shortened approaching the bonding platform. Thus, downward control of the micromirror tip, tilt, and piston deflection is possible simply through varying the bias voltages on the actuator electrodes.

Figure 5A:
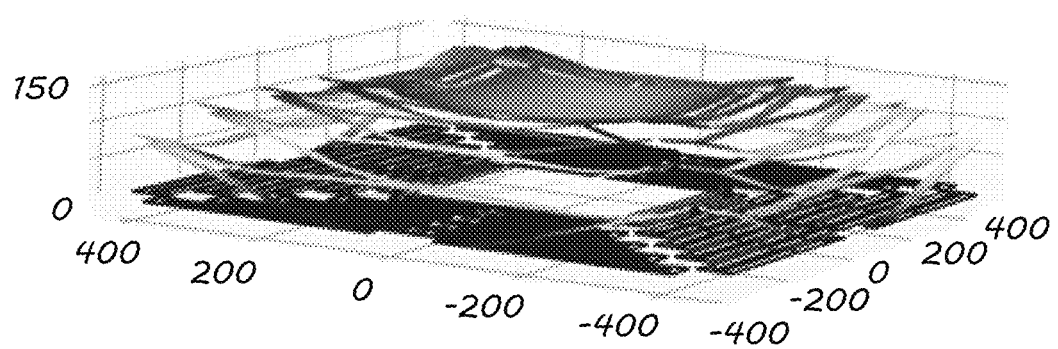
FIG. 5A illustrates a peak, upward beam deflection of 150 μm for identical center contact designs with the same physical actuator dimensions as shown in FIG. 1A with an aluminum metal layer.
Figure 5B:
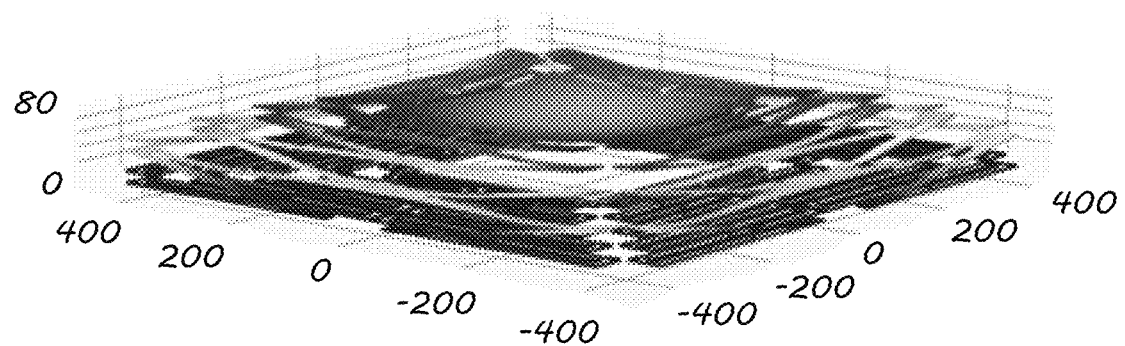
FIG. 5B illustrates a peak, upward beam deflection of 80 μm for identical center contact designs with the same physical actuator dimensions as shown in FIG. 1A with a gold metal layer.

FIGS. 5A and 5B illustrate the effect of changing the metal layer on the performance of the center contact design of FIG. 1A with identical physical bimorph beam dimensions. The only difference is the metal layer chosen within the bimorph beam from aluminum to gold. The initial upward deflection for the aluminum beam shown in FIG. 5A is approximately 150 μm while FIG. 5B shows the gold bimorph beam with only about 80 μm of deflection. For this minor material modification, the primary reason for the deflection difference was the difference in CTE and the difference in Young's modulus of the materials.

Figure 6:
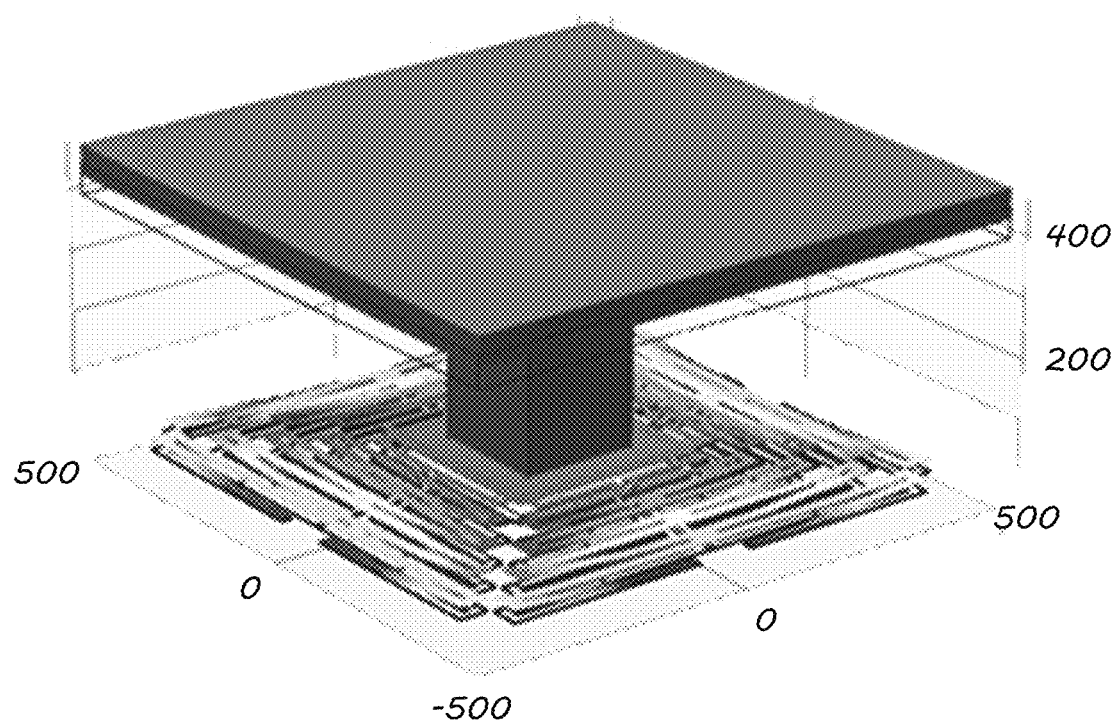
FIG. 6 illustrates the total upward deflection following release of the micromirror of FIG. 3.

FIG. 3. Illustrates the center contact structural design concept with an SOI micromirror bonded onto the bonding pad of the actuator assembly. FIG. 3 shows the basic design concept 10 with the cantilever style beams 12 attached to a bonding platform 14. This bonding platform 14 is used to bond and support the micromirror pillar 16 and mirror plate 18 to enable the deflection and piston motion. In this design, the entire structure used for actuation will be fabricated on a single wafer while the micromirror pillar and mirror will be fabricated from an SOI wafer or some other surface micromachining technique. FIG. 6 illustrates the modeled upward deflection created by the inherent residual stress, CTE difference, and the different Young's modulus in the cantilever like beams to provide the initial, post-released peak upward displacement. All remaining deflections and piston motion will occur due to controlled, user-driven cantilever beam deflection. The overall integration between the micromirror and the actuation technique may be through basic adhesion bonding to the actuation platform through the use of epoxy or metal-to-metal fusion bonding, though other bonding methods may also be used.

Embodiments of the invention are based on different actuator design concepts, which are tailorable to meet a wide variety of application specifications. These designs may be fabricated using a wide range of materials to create the large out-of-plane upward deflections from surface micromachining principles to enable the large angle tip/tilt and piston motion to properly steer an optical beam. From these design concepts, large angle beamsteering can be performed while also exhibiting a high fill-factor for optical applications. Through some basic design changes to the center contact design, this design may be used as either an electrostatic or an electrothermal design. The actual selection between the electrostatic or the electrothermal design is dependent on the application. An electrostatic design will require higher voltages to actuate the structure, but will benefit from switching speeds that will be much faster than an electrothermal design. The electrothermal design will require lower voltages and will exhibit larger power consumption than the electrostatic design. However, the electrothermal design will also enable larger forces to be generated and applied to the structure for implementing the tip/tilt and piston motions.

A large out-of-plane deflection is the first stage in developing a large out-of-plane beamsteering technique for a surface micromachined device. In general, the large out-of-plane deflections may be achieved by capitalizing on the materials inherent residual stress and Young's modulus as well as the difference in the materials coefficient of thermal expansion (CTE) to form a traditional bimorph design. In addition, the material thickness, beam lengths, the number of beams, and the deposition of the multi-layers which make up the beams all significantly contribute to the peak out-of-plane deflection. The upward deflections can be tailored to the application need as nearly all metals, dielectrics, semiconductor, and polymer materials can be used to create these devices. The only caveat to this is during the fabrication processes, one needs to select materials that can withstand the various etching and patterning processes. The illustrated embodiments of an actuation system are made up of four individually controlled bimorph actuators which enables system tip/tilt motion to angles of ±45 degrees as well as provide a piston motion if all four actuators are biased simultaneously. These are low voltage actuation systems which operate on electrostatics (less than 100V) to pull down the actuators to create the required forces to tip/tilt or piston drive the overall system. Electrothermal designs are again based on the traditional bimorph structure but joule heating is the actuation mechanism at less than 10 V. A preferred configuration for the overall system would be an array of these actuation structures which exhibit a high fill-factor greater than 90% to mitigate signal loss and maximize beam reflection/detection.

Figure 7A:
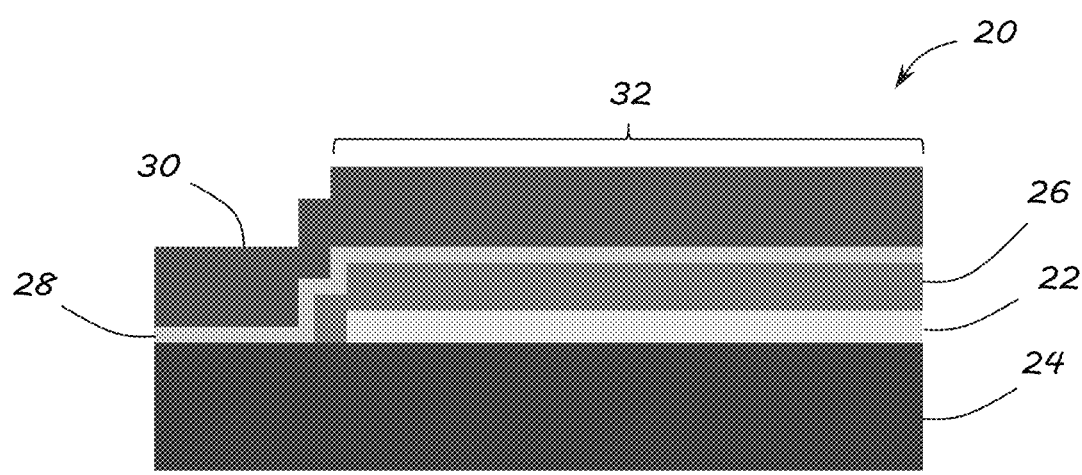
FIG. 7A illustrates an overall design concept of the actuation assembly for large out-of-plane deflections as deposited layers prior to release.
Figure 7B:
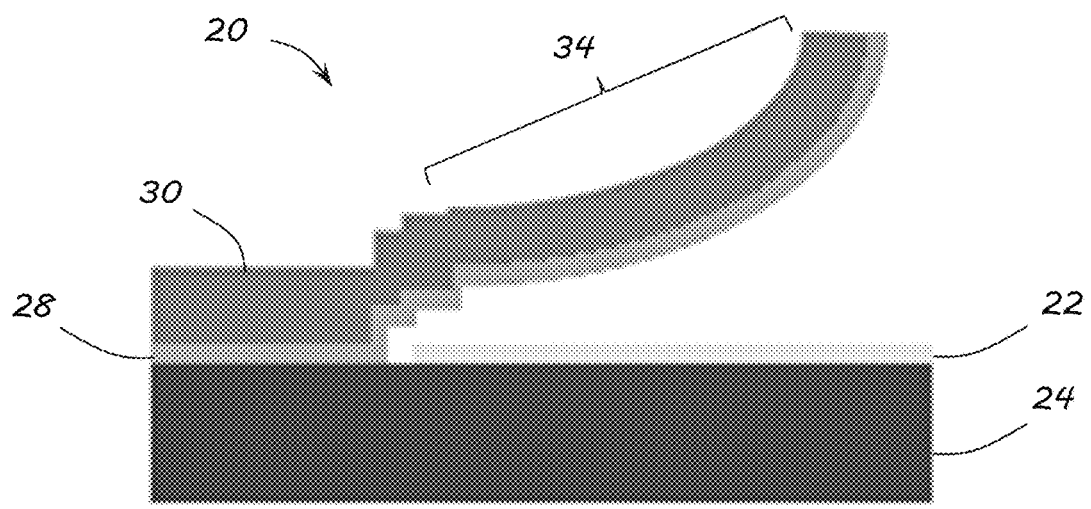
FIG. 7B illustrates a post released structure of FIG. 7A showing the out-of-plane upward deflection.
Figure 7C:
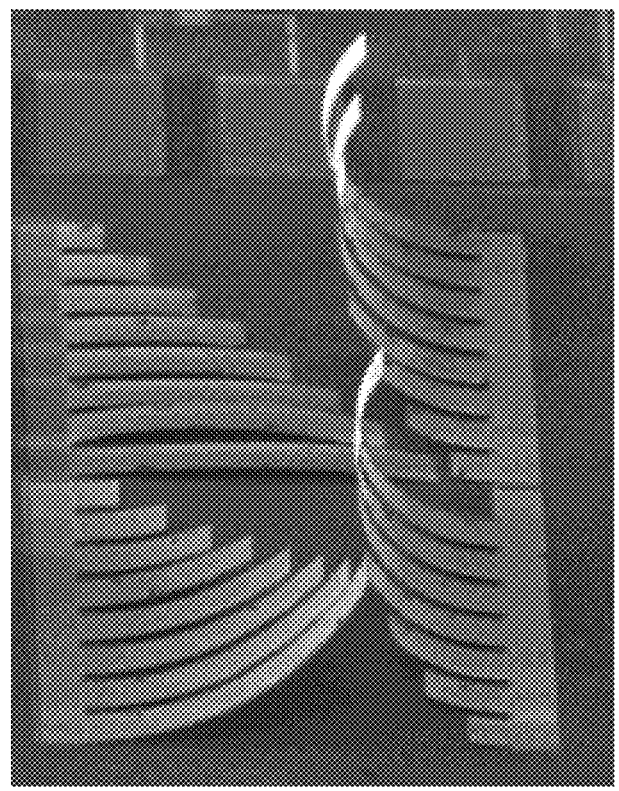
FIG. 7C illustrates an SEM image of bimorph cantilever beams for an actual structure in a released configuration.

As shown in FIGS. 1A and 1B above, to maximize the out-of-plane deflections, different material layers are used to create bimorph beam structures of an actuation assembly. The actuator design concept capitalizes on the residual stress and the coefficient of thermal expansion (CTE) differences between the layers. An exemplary layout 20 is shown in FIG. 7A. In the exemplary embodiment illustrated in FIG. 7A, an electrode 22 is formed on a substrate 24. A sacrificial layer 26 is formed over the electrode. An insulator 28 is then formed over the sacrificial layer 26 and a portion of the substrate 24. Finally, a metal 30 is formed over the insulator 28, where a portion 32 of the metal 30 is under a tensile stress. When the sacrificial layer 26 is removed, the configuration is "released" and a portion 34 of the metal layer 30 deforms due to the prestressed condition as shown in FIG. 7B. FIG. 7C shows a scanning electron microscope (SEM) image of the design concept as fabricated in the PolyMUMPs foundry process.

The electrostatic and electrothermal actuation systems may be made utilizing surface micromaching in which thin material layers are deposited and photolithography patterned on the surface of the wafer. These actuators may be developed in a wide variety of materials, deposition techniques, and fabrication facilities, even to include available commercial foundries. This design concept can be used as a key component in a wide variety of large angle beam steering approaches for platforms and UAVs. The structures may also be used for imaging and scene generation.

There are a wide range of alternatives to these electrostatic and electrothermal actuators. All one needs to verify is the residual stresses, Young's modulus, and the CTE of the selected materials meet the application requirements. The greater the difference in CTE values, the greater the possible deflections. Generally, a conductive layer 30 is required to create the lower electrode 22 and a second conductive layer as part of the actuation platform to enable the electrostatic attraction for device operation, which is similar to the electrothermal design with the lower electrode 22 not being required. These metal layers could be gold, aluminum, chromium, titanium, platinum, copper, and nickel, among others, while the dielectric layers could be silicon dioxide, silicon nitride, hafnium oxide, and aluminum oxide, among others. Various polymers could also be used to create these device structures but care would need to be taken to mitigate possible etching during the patterning and development of the structures. One of the key concepts in creating these structures is in the material selection such that there is a fairly large difference in CTE as well as the Young's modulus of the material. A higher Young's Modulus will create a more rigid and stable structure but there are limits as bending must occur to create the tip and tilting of the platform from the actuators.

A MEMS commercial foundry may also be used in addition to in-house fabrication efforts to make these large out-of-plane structures. As illustrated in the various figures, a designer has a wide range of options to meet there desired application goals from the physical size of the device, to material selections, to residual stress levels within these layers. From these options, designers can create low angle tip/tilt/piston driven devices to very large out-of-plane structures which enable large angle tip/tilt and piston motion.

The above illustrated embodiments of the invention are based on the use of the PolyMUMPs foundry fabrication as a baseline or foundation of the overall system. From this foundry, large angle beamsteering while exhibiting a high fill-factor is not possible. Thus, from the baseline process, several post-processing steps may be performed to enable the large out-of-plane upward deflections to permit large angle beamsteering. Initial as fabricated structures from the foundry generally provide a peak out-of-plane deflection of approximately 11 µm to 140 µm, depending upon the design. Performing post-processing depositions of high temperature gold and a compressively stressed silicon nitride layer on these same designs, the peak out-of-plane deflections increase from greater than 200 µm to over 1 mm. These post-processing methods are viable for both electrostatic and electrothermal designs.

The electrostatic and electrothermal actuation systems are constructed utilizing surface micromaching in which thin material layers are deposited and photolithography patterned on the surface of the wafer. The actuators may be developed in the PolyMUMPs foundry process as outlined below with additional post-processing steps to include high-temperature gold evaporation and PECVD silicon nitride layers deposited prior to the final release. This design concept may be used as a key component in a wide variety of large angle beam steering approaches for platforms and UAVs. The structures can also be used for imaging and scene generation.

The foundation of the exemplary designs use the PolyMUMPs fabrication process which is outlined in Cowen et al., "PolyMUMPs™ Design Handbook," Revision 13, which is incorporated by reference herein in its entirety, though other fabrication processes may also be used. FIG. 8A illustrates a cross sectional view of all deposition layers and the table in FIG. 8B outlines each layer thickness and layer functionality. The surface material layers may be deposited by low pressure chemical vapor deposition (LPCVD). The sacrificial oxide layers, which consist of phosphosilicate glass (PSG) for this illustrated example, serve two purposes. First, they define the gaps between structural layers, and second, they serve as a dopant source for the 1050 C high temperature phosphorus diffusions, which assists in reducing the resistivity in the polysilicon structural layers. All surface layers may be patterned using standard photolithography techniques and etched using Reactive Ion Etching (RIE) or other etching methods. The final surface layer, a 0.5 µm-thick gold metallization layer with a 100 nm chrome adhesion layer is deposited and patterned using a standard lift-off technique. Lastly, a release etch is performed to remove the sacrificial oxide layers freeing the structural polysilicon layers (Poly1 and Poly2). The typical release etch is performed by immersing the die in room temperature hydrofluoric (49%) acid for 2-3 minutes, methanol rinses to stop the HF etch, and then a supercritical carbon dioxide ($CO_2$) rapid dry to minimize stiction of the actuation assemblies. Note that for the electrothermal actuators embodiments designed in this process, only the Poly2 and gold layers need be used to create a foundation for further device development through the addition of other material layers.

Figure 9A:
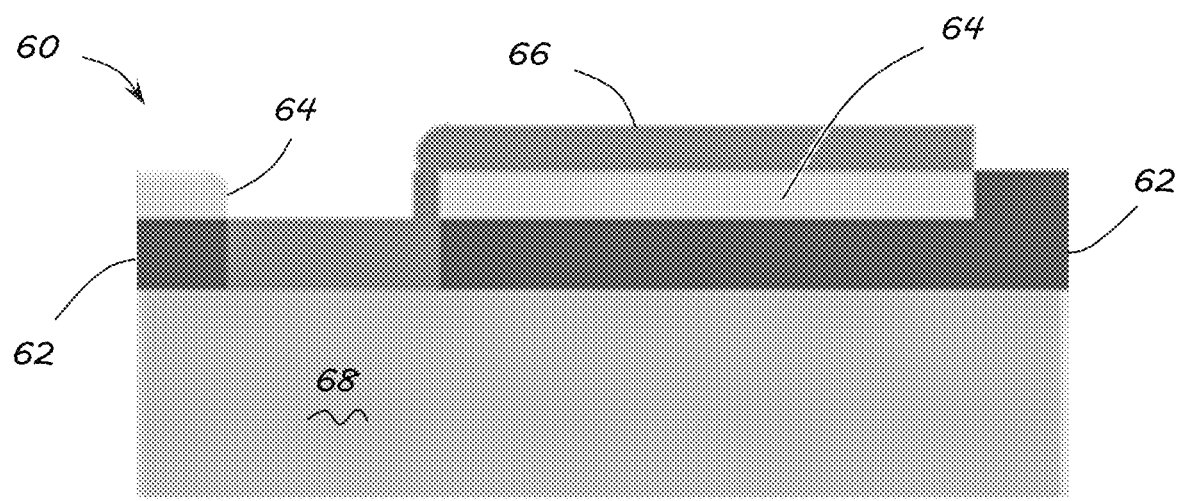
FIGS. 9A-9C illustrate a fabrication sequence of the post-processed actuation assembly from baseline design received from a foundry to a released structure.
Figure 9B:
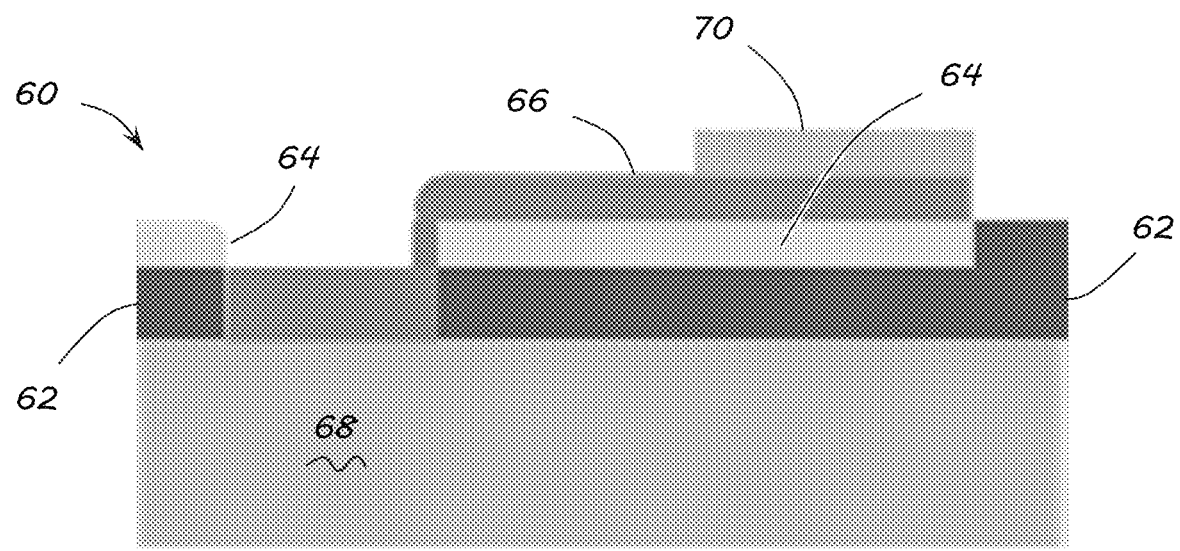
Figure 9C:
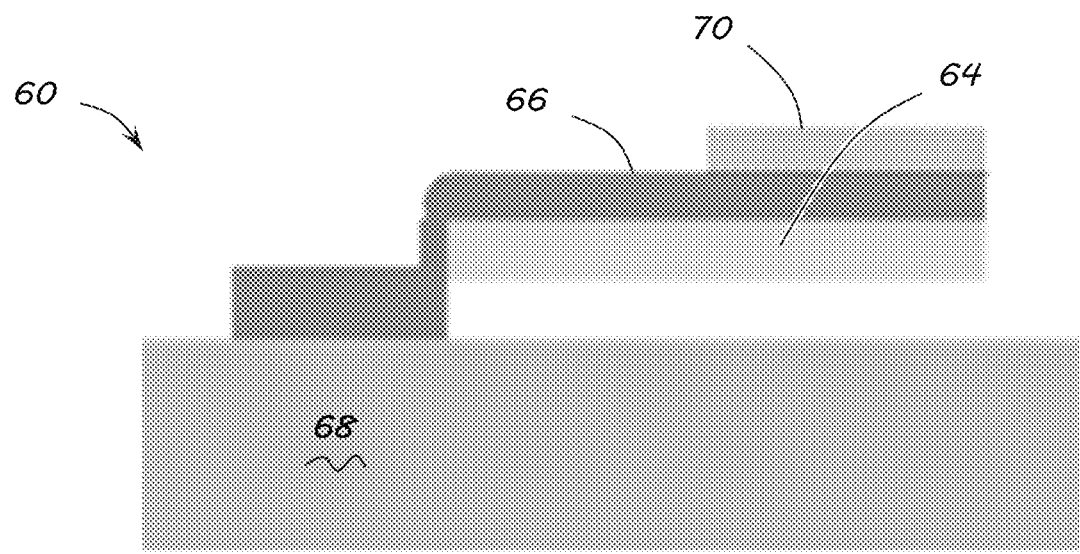

In order to implement the post-processing steps, which must be completed to enable the large out-of-plane deflections, a series of masks are needed to define the construction of the additional material deposition patterns for the beam structures. FIGS. 9A-9C illustrate the post-processing fabrication process. The process begins with a baseline foundry fabrication 60 from PolyMUMPs including a silicon dioxide layer 62, polysilicon layer 64, and gold layer 66 on a 1 $cm^2$ silicon die 68 as shown in FIG. 9A. From this baseline, the PolyMUMPs gold layer 66 may be used or it may be etched off and redeposited with a high temperature (up to 300 C) gold evaporation layer. Following this gold deposition, a high compressive stressed silicon nitride layer 70 is deposited using Plasma Enhanced Chemical Vapor Deposition (PECVD) at a thickness of 1 µm and then photo lithographically patterned using AZ5214 photoresist. Following the UV exposure and development, the silicon nitride layer 70 is etched using reactive ion etching (RIE) and then the remaining photoresist is removed using acetone. Following the deposition and patterning of the silicon nitride layer, the three layer stacked material beam structures which make up the actuation assembly is completed and shown in FIG. 9B. Finally, the sacrificial silicon dioxide layer 62 may be removed using 49% hydrofluoric acid (see FIG. 9C) which is then followed by a $CO_2$ critical point dry to fully release and dry the actuation assembly. While certain deposition and removal methods were used with this illustrated embodiment, other deposition and removal methods may also be used.

Figure 10:
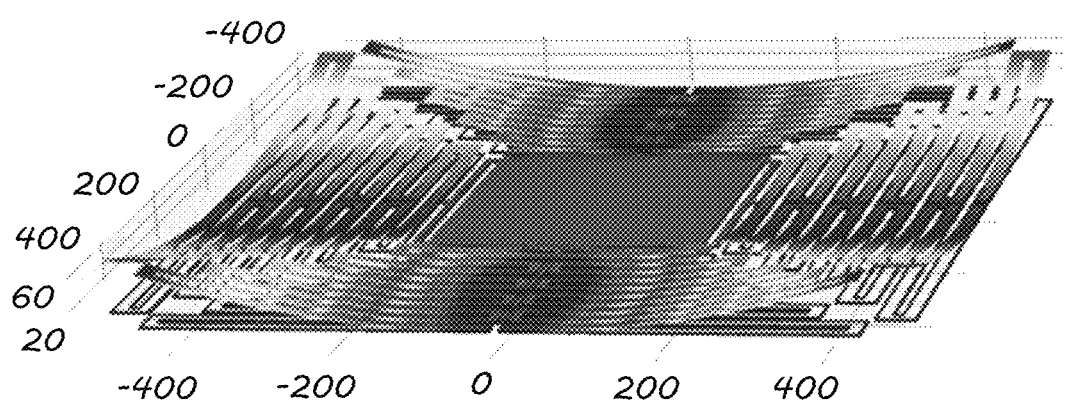
FIG. 10 shows a deformed model of an electrothermal design as fabricated in PolyMUMPs.

COMSOL® finite element modeling (FEM) software was used to model the pre and post-processed foundry fabricated MEMS designs to determine the out-of-plane deflections. Based on the design constraints of the foundry process and an allotted design space criteria for a single element (1 $mm^2$), the PolyMUMPs foundry does not meet the required deflections as shown in the COMSOL® simulation shown in FIG. 10 of the structure. As seen in FIG. 10, there is an overall peak deflection of zero microns. This is due to the full bimorph beams lacking a bending moment component which can force the beam tips to deflect downward, creating an elongated 'S' shaped final profile. In the current PolyMUMPs foundry fabrication, there are no additional material layers available which can be used to create this bending moment.

Figure 11:
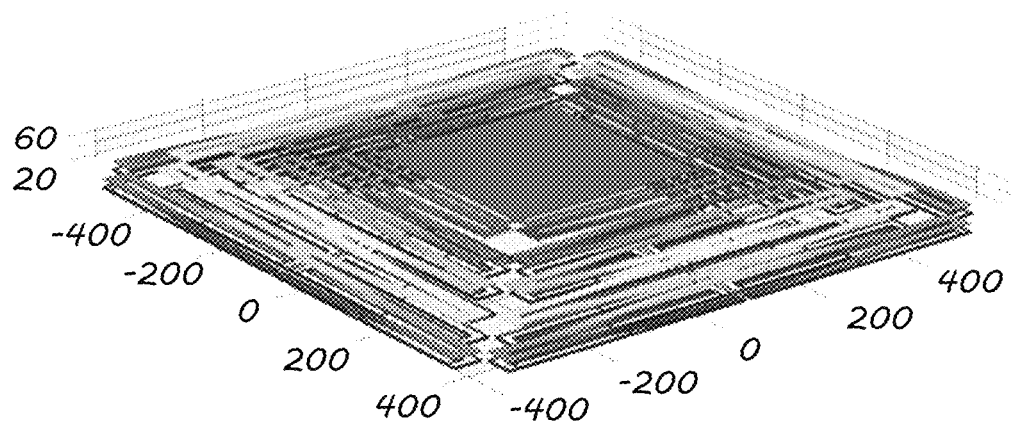
FIG. 11 shows a deformed model of the electrothermal design of FIG. 10 with a post-processed SiN layer.
Figure 12:
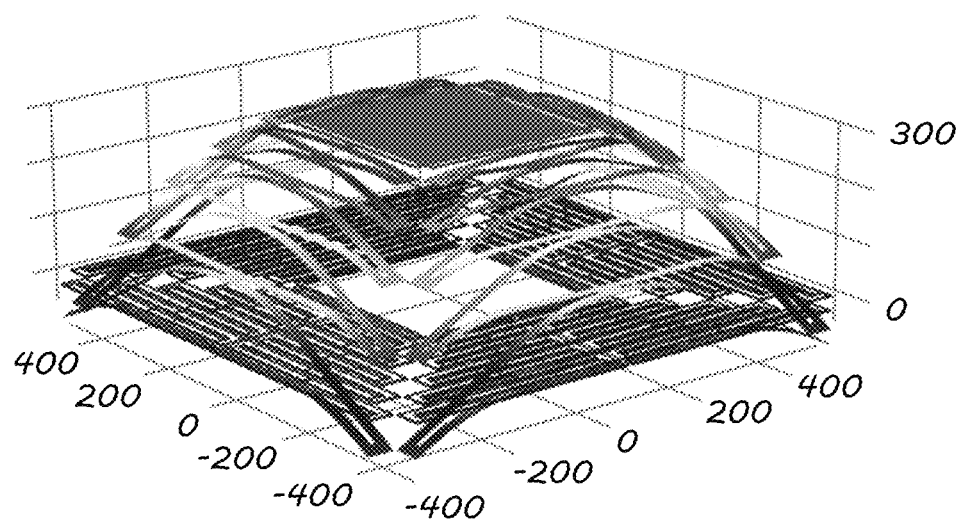
FIG. 12 shows a deformed model of the post-processed electrothermal design of FIG. 11 with a 300 C gold metal evaporation layer replacing the PolyMUMPs gold layer.

As illustrated in FIG. 10, the image illustrates the bimorph beams upward bending which when coupled with a silicon nitride (SiN) deposition placed on top of the gold/polysilicon stacked beams, can indeed create the necessary bending moment to cause the actuation assembly to deflect upward as shown in FIGS. 11 and 12. Therefore, through the use of the PolyMUMPs structural layers as the foundation of the actuation assembly, post processing depositions of SiN (FIG. 11) and high temperature gold metal evaporation (up to 300 C) (FIG. 12) may be used to achieve the upward deflections needed for large angle beam steering. FIG. 11 illustrates the as fabricated PolyMUMPs electrothermal design with a SiN layer deposited by plasma enhanced chemical vapor deposition (PECVD) at a stress level of −200 MPa at 300 C shows a deflection of ~50 µm. In FIG. 12, the PolyMUMPs gold layer was removed and replaced with a gold layer deposited at 300 C. A −500 MPa PECVD SiN layer was then deposited at 300 C. As shown in FIG. 12, over 250 µm can be achieved using these post-processing techniques. The electrothermal PolyMUMPs design provided an out-of-plane deflection of 162±5 µm using a coupled SiN layer exhibiting a stress level of −930 MPa. All deflections are determined using white light interferometry (IFM).

Figure 13A:
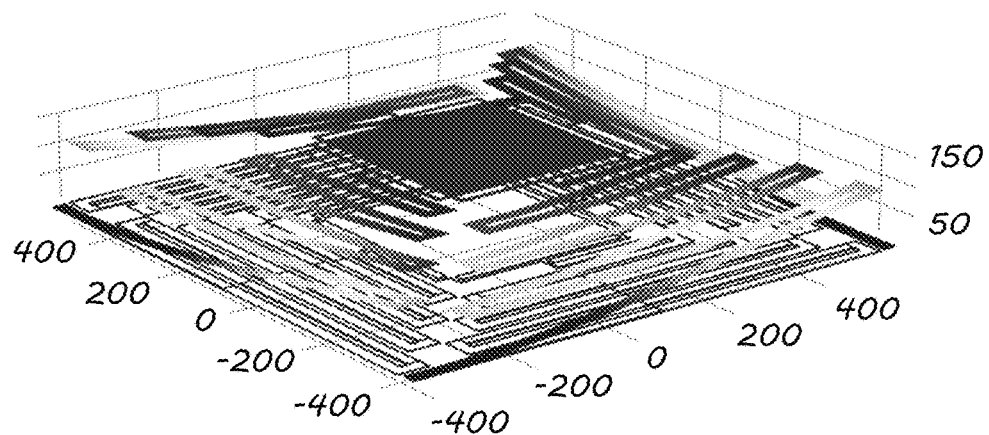
FIG. 13A shows a deformed model of an electrostatic serpentine design.
Figure 13B:
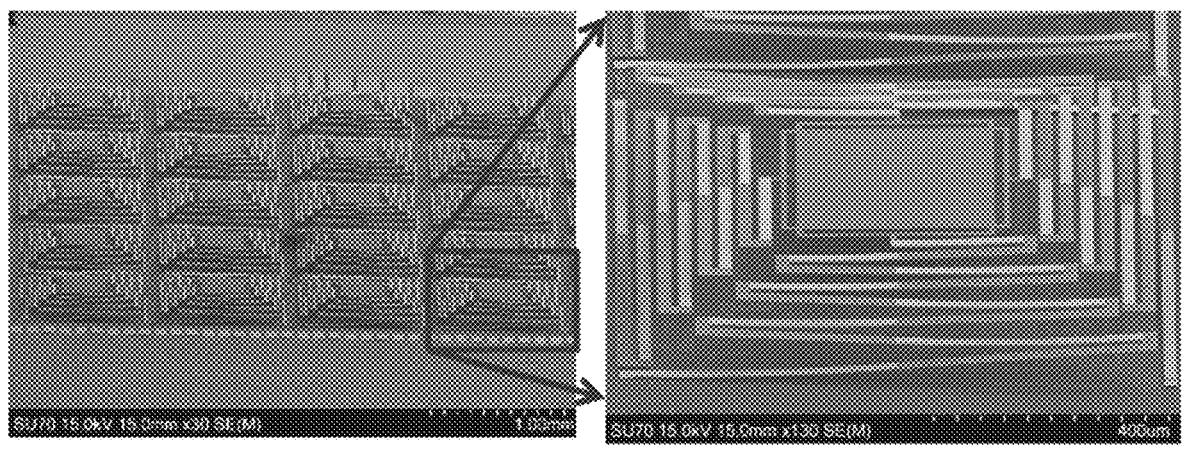
FIG. 13B shows scanning electron microscope images of the electrostatic device in FIG. 13A.

The post-processing steps outlined above were repeated for an electrostatically actuated design utilizing a beam structure in the form of a folded cantilever beam or serpentine layout. The baseline electrostatic serpentine design fabricated in the PolyMUMPs fabrication process resulted in an out-of-plane deflection of ~140 µm as shown in the COMSOL® image in FIG. 13A. FIG. 13B illustrates a 5×4 array of these structures with a close up view shown on the right of a single actuation assembly. The out-of-plane deflection was measured to be ~148 µm using an IFM. This deflection does not meet the out-of-plane deflections required for large angle beam steering; thus, a PECVD SiN layer was deposited with the same compressive stress level of −930 MPa as previously stated. This resulted in an experimentally measured out-of-plane deflection of over 1 mm. This is far too high so the PECVD deposition parameters for this design will need to be adjusted to reduce the stress level in the nitride layer. The electrostatically actuated center contact design has deflections greater than 430 um.

FIGS. 14A-14D provide additional exemplary L-Edit torsional spring design attachments, which may be used, and which exhibit varying degrees of torsional and twisting stiffness. The platform/spring assembly shown in FIG. 14A provides a moderately high spring constant for both the piston and tip/tilt motions, FIG. 14B provides a high spring constant which is ideal for rigidity and reliability of the platform assembly but also nearly mitigates any piston or tip/tilt motions when a 2 µN force is applied at Point A and B. FIG. 14C illustrates a lower spring constant which makes the platform motions resulting from forces applied to Points A and B greater but still results in the opposite actuator moving downward, reducing the peak tilt angle achievable. FIG. 14D provide the best spring constants for this project as it allows for significant deflection of the platform resulting from either a force applied to Point A or B. However, the spring constants are high enough to maintain structural integrity following either actuation event.

Figure 15A:
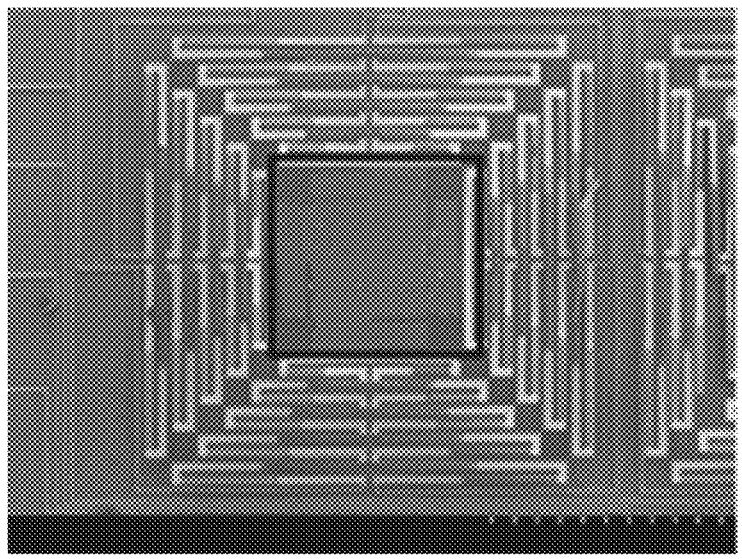
FIG. 15A includes a SEM image of a completed, unreleased PolyMUMPs™ micromirror actuation assembly.
Figures 15B, 15C:
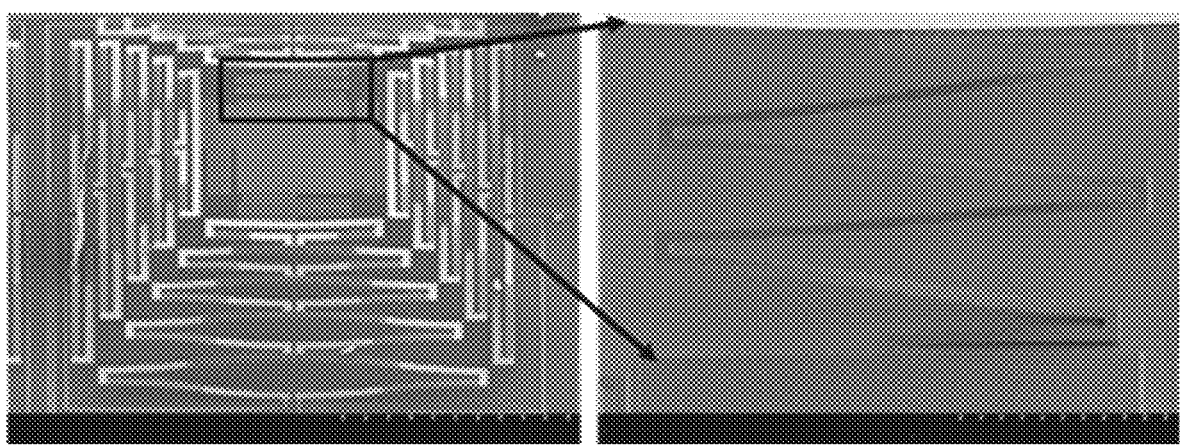
FIG. 15B includes a SEM image of the same device in FIG. 15A following sacrificial oxide release.
FIG. 15C includes a SEM image of a portion of FIG. 15B where the torsional spring is fully extended under an actuation condition.

The images shown in FIGS. 14A-14D show several exemplary complete micromirror designs illustrating the torsional spring/platform assembly design as shown in FIG. 14D with the platform assembly boxed in FIG. 15A. FIG. 15A provides a top image of the complete unreleased micromirror actuation design with the actuation assembly and platform assembly integrated to form one element of a micromirror actuation array. The structures shown in FIGS. 15A-15C were fabricated in the PolyMUMPs™ process such that the torsional spring attachment is ~1.5 µm thick with a width of 8 µm. FIG. 15B illustrates a released micromirror actuation assembly which is deflected ~273 µm out-of-plane with the spring attachment boxed and reimaged in FIG. 15C when the spring is fully deflected. As can be observed in FIG. 15C, the spring is flexible enough to not fracture during full actuation conditions.

This realization of several exemplary torsional spring attachments were presented, which is the critical linkage between the micromirror actuation assembly and the platform assembly. COMSOL® models were used to assess the viability of the various torsional spring designs for rigidity and flexibility to perform piston motion as well as for tip/tilt motion. The fabricated structures were presented which clearly shows the torsional spring does not fracture when in its fully extended position. As set forth above, choices of materials with these geometries affect performance and may be tuned to specific requirements and applications.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. An actuator element of a MEMS device fabricated using surface micromachining on a substrate to create large, out-of-plane deflection, the actuator element comprising:
   an insulating layer having a first portion directly contacting the substrate and a second portion separated from the substrate by a gap;
   a metallic layer having a first portion directly formed on the first portion of the insulating layer and a second portion directly formed on the second portion of the insulating layer,
   wherein the second portion of the metallic layer is prestressed.

2. The actuator element of claim 1, further comprising:
   an electrode formed on the substrate in the gap between the second portion of the insulating layer and the substrate.

3. The actuator element of claim 1, wherein the second portion of the metallic layer is tensilely prestressed.

4. The actuator element of claim 1, wherein the metallic layer is selected from a group consisting of gold, aluminum, chromium, titanium, platinum, copper, nickel, and combinations thereof.

5. The actuator element of claim 1, wherein the insulating layer is selected from a group consisting of silicon dioxide, silicon nitride, hafnium oxide, aluminum oxide, and combinations thereof.

6. An actuator element of a MEMS device fabricated using surface micromachining on a substrate, the actuator element comprising:
   a first insulating layer positioned above the substrate and separated from the substrate by a gap;
   a metallic layer having a first portion directly contacting the substrate and a second portion directly contacting the insulating layer;
   a second insulating layer directly formed on a portion of the second portion of the metallic layer opposite the first insulating layer,
   wherein the second insulating layer is prestressed.

7. The actuator element of claim 6, wherein the metallic layer comprises gold.

8. The actuator element of claim 6, wherein the first insulating layer comprises polysilicon.

9. The actuator element of claim 6, wherein the second insulating layer comprises silicon nitride.

10. The actuator element of claim 6, wherein the second insulating layer is compressively prestressed.

11. A MEMS device on a substrate:
    a platform;
    an actuator assembly composed of a plurality of actuator elements, the actuator assembly connected to the platform;
    the actuator elements of the plurality of actuator elements including:
       an insulating layer having a first contacting portion and a second portion;
       a metallic layer having a first portion directly formed on the first contacting portion of the insulating layer and a second portion directly formed on the second portion of the insulating layer,
       wherein the second portion of the metallic layer is prestressed;
    wherein actuation of the plurality of the actuator elements in the actuator assembly causes motion in the platform,
    wherein each actuator element of the plurality of actuator elements has a first end and a second end,
    wherein the first end of a first actuator element of the plurality of actuator elements is connected to the substrate and the second end of a last actuator element of the plurality of actuator elements is connected to the platform, and
    wherein the first ends of the remaining plurality of actuator elements are connected to the second ends of other actuator elements between the first and last actuator elements of the plurality of actuator elements to form a chain.

12. The MEMS device of claim 11, wherein the second portion of the insulating layer is separated from an electrode by a gap.

13. The MEMS device of claim 11, wherein the second portion of the metallic layer of the actuator element is tensilely prestressed.

14. The MEMS device of claim 11, wherein the metallic layer of the actuator element is selected from a group consisting of gold, aluminum, chromium, titanium, platinum, copper, nickel, and combinations thereof.

15. The MEMS device of claim 11, wherein the insulating layer of the actuator element is selected from a group consisting of silicon dioxide, silicon nitride, hafnium oxide, aluminum oxide, and combinations thereof.

16. A MEMS device on a substrate:
    a platform;
    an actuator assembly composed of a plurality of actuator elements, the actuator assembly connected to the platform;
    the actuator elements of the plurality of actuator elements including:
       a first insulating layer positioned above the substrate and separated from the substrate by a gap;
       a metallic layer having a first contacting portion and a second portion directly contacting the insulating layer;
       a second insulating layer directly contacting a portion of the second portion of the metallic layer opposite the first insulating layer,
       wherein the second insulating layer is prestressed;
    wherein actuation of the plurality of the actuator elements in the actuator assembly causes motion in the platform,
    wherein each actuator element of the plurality of actuator elements has a first end and a second end,
    wherein the first end of a first actuator element of the plurality of actuator elements is directly connected to the substrate and the second end of a last actuator element of the plurality of actuator elements is directly connected to the platform, and wherein the first ends of the remaining plurality of actuator elements are directly connected to the second ends of other actuator elements between the first and last actuator elements of the plurality of actuator elements to form a chain.

17. The MEMS device of claim 16, wherein the second insulating layer of the actuator element is compressively prestressed.

18. The MEMS device of claim 16, wherein the metallic layer of the actuator element comprises gold.

19. The MEMS device of claim 16, wherein the first insulating layer of the actuator element comprises polysilicon.

20. The MEMS device of claim 16, wherein the second insulating layer of the actuator element comprises silicon nitride.

* * * * *